United States Patent
Chen et al.

(10) Patent No.: US 9,859,326 B2
(45) Date of Patent: Jan. 2, 2018

(54) SEMICONDUCTOR DEVICES, IMAGE SENSORS, AND METHODS OF MANUFACTURE THEREOF

(71) Applicant: Taiwan Semiconductor Manufacturing Company, Ltd., Hsin-Chu (TW)

(72) Inventors: Sheng-Chau Chen, Tainan (TW); Tung-Ting Wu, Taipei (TW); Cheng-Ta Wu, Shueishang Township (TW); Chih-Hui Huang, Yongkang (TW); Yeur-Luen Tu, Taichung (TW); Jhy-Jyi Sze, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/163,944

(22) Filed: Jan. 24, 2014

(65) Prior Publication Data

US 2015/0214267 A1    Jul. 30, 2015

(51) Int. Cl.
    *H01L 27/146*    (2006.01)

(52) U.S. Cl.
    CPC .... *H01L 27/14683* (2013.01); *H01L 27/1462* (2013.01); *H01L 27/14623* (2013.01); *H01L 27/14636* (2013.01); *H01L 27/1463* (2013.01); *H01L 27/1464* (2013.01)

(58) Field of Classification Search
    CPC ............................ H01L 27/1464; H01L 27/146
    See application file for complete search history.

(56) References Cited

U.S. PATENT DOCUMENTS

| | | | |
|---|---|---|---|
| 5,914,498 A * | 6/1999 | Suzawa et al. | 257/66 |
| 8,410,418 B2 * | 4/2013 | Yamaguchi | H01L 27/1461 250/214.1 |
| 2006/0189062 A1* | 8/2006 | Deng | B29D 11/00278 438/201 |
| 2009/0095891 A1* | 4/2009 | Park | H01L 27/14621 250/226 |
| 2009/0134485 A1* | 5/2009 | Lee | H01L 27/14667 257/448 |
| 2009/0201393 A1* | 8/2009 | Tai et al. | 348/243 |
| 2010/0091163 A1* | 4/2010 | Liao et al. | 348/308 |
| 2011/0242350 A1* | 10/2011 | Sawayama | 348/222.1 |

(Continued)

OTHER PUBLICATIONS

Kim, N.-H. et al., "Capability of Prevention of Fluorine Penetration for SRO and SiN Capping Films," Journal of the Korean Physical Society, vol. 45, Dec. 2004, pp. S836-S839.

*Primary Examiner* — Lex Malsawma
*Assistant Examiner* — Xia Cross
(74) *Attorney, Agent, or Firm* — Slater Matsil, LLP

(57) ABSTRACT

Semiconductor devices, image sensors, and methods of manufacture thereof are disclosed. In some embodiments, a semiconductor device includes a high dielectric constant (k) insulating material disposed over a workpiece, the high k insulating material having a dielectric constant of greater than about 3.9. A barrier layer is disposed over the high k insulating material. A buffer oxide layer including a porous oxide film is disposed between the high k insulating material and the barrier layer. The porous oxide film has a first porosity, and the barrier layer or the high k insulating material has a second porosity. The first porosity is greater than the second porosity.

20 Claims, 8 Drawing Sheets

(56) References Cited

U.S. PATENT DOCUMENTS

| | | | |
|---|---|---|---|
| 2012/0086093 A1* | 4/2012 | Otsuka et al. ................ | 257/432 |
| 2012/0202311 A1* | 8/2012 | Chiang ............ | H01L 27/14621 |
| | | | 438/70 |
| 2012/0273906 A1* | 11/2012 | Mackey ............ | H01L 27/14605 |
| | | | 257/432 |
| 2012/0292616 A1* | 11/2012 | Ohshima ......................... | 257/43 |
| 2013/0323875 A1* | 12/2013 | Park et al. ...................... | 438/70 |
| 2013/0334511 A1* | 12/2013 | Savas et al. .................... | 257/40 |

* cited by examiner

SEMICONDUCTOR DEVICES, IMAGE SENSORS, AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example. Integrated circuit dies are typically formed on a front side of semiconductor wafers. The integrated circuit dies may comprise various electronic components, such as transistors, diodes, resistors, capacitors, and other devices. The integrated circuit dies may comprise various functions, such as logic, memory, processors, and/or other functions.

Complementary metal oxide semiconductor (CMOS) image sensors are used in cameras, cell phones, and other electronic devices for capturing images. Back side illumination (BSI) image sensors are CMOS image sensors in which light enters from a back side of a substrate, rather than the front side. BSI sensors are capable of capturing more of an image signal than front side illumination sensors due to a reduced reflection of light.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
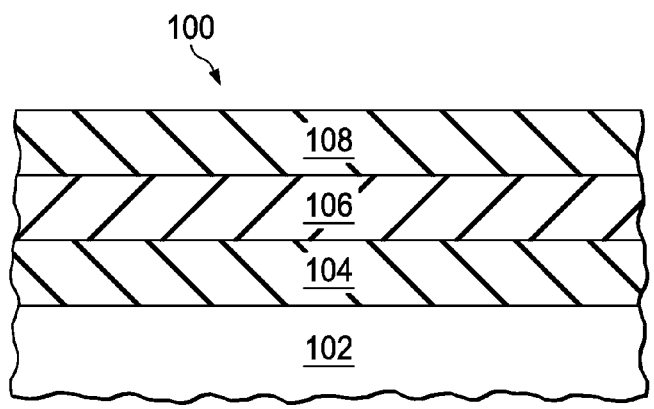
FIG. 1 is a cross-sectional view illustrating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100 in accordance with some embodiments. The semiconductor device 100 includes a workpiece 102. The workpiece 102 may include a semiconductor substrate comprising silicon or other semiconductor materials and may be covered by an insulating layer, for example. The workpiece 102 may also include active components or circuits, not shown. The workpiece 102 may comprise silicon oxide over single-crystal silicon, for example. The workpiece 102 may include conductive layers and/or semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples. The workpiece 102 comprises phosphorous-doped (P-doped) silicon in some embodiments. In some embodiments, the workpiece 102 comprises a sensor device including an integrated circuit. The sensor device includes one or more pixel arrays that include a plurality of photo diodes in some embodiments, for example, to be described further herein.

The semiconductor device 100 includes a high dielectric constant (k) insulating material 104 disposed over the workpiece 102. The high k insulating material 104 has a dielectric constant that is greater than a dielectric constant of silicon dioxide, which is about 3.9, in some embodiments. The high k insulating material 104 comprises a material such as HfO, $Ta_2O_5$, $Al_2O_3$, other dielectric materials, or a combination or multiple layers thereof in some embodiments. The high k insulating material 104 comprises a thickness of about 4,000 Angstroms or less in some embodiments. The high k insulating material 104 comprises a single material layer or a plurality of material layers in some embodiments. Alternatively, the high k insulating material 104 may comprise other materials and dimensions.

A barrier layer 108 is disposed over the high k insulating material 104. A buffer oxide layer 106 comprising a porous oxide film (not shown in FIG. 1; see porous oxide film 120 shown in FIG. 2) is disposed between the high k insulating material 104 and the barrier layer 108. The porous oxide film 120 comprises a first porosity, and the barrier layer 108 or the high k insulating material 104 comprises a second porosity, wherein the first porosity is greater than the second porosity, in some embodiments. The porous oxide film 120 of the buffer oxide layer 106 is more porous than the high k insulating material 104 and/or the barrier layer 108 in some embodiments, for example.

The barrier layer 108 comprises silicon oxide or silicon nitride in some embodiments. The buffer oxide layer 106 comprises a single material layer or a plurality of material layers in some embodiments.

Figure 2:
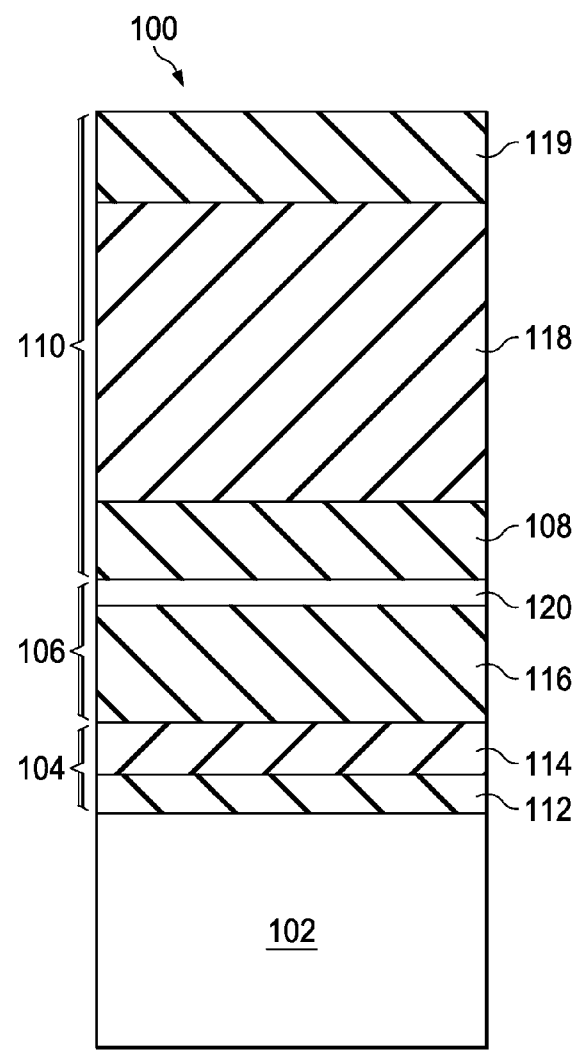
FIG. 2 is a cross-sectional view illustrating a semiconductor device in accordance with some embodiments.

FIG. 2 is a cross-sectional view illustrating a semiconductor device 100 in accordance with some embodiments. The high k insulating material 104 comprises a first layer 112 and a second layer 114 disposed over the first layer 112. The first layer 112 comprises HfO having a thickness of about 30 Angstroms to about 80 Angstroms in some embodiments. The first layer 112 comprises a thickness of about 60 Angstroms in some embodiments. The first layer 112 is formed over the workpiece 102 using chemical vapor deposition (CVD), atomic layer deposition (ALD), physical vapor deposition (PVD), or other methods. The second layer 114 comprises $Ta_2O_5$ having a thickness of about 400 Angstroms to about 600 Angstroms in some embodiments. The second layer 114 comprises a thickness of about 520 Angstroms in some embodiments. The second layer 114 is formed over the first layer 112 using PVD or other methods in some embodiments. Alternatively, the first layer 112 and second layer 114 of the high k insulating material 104 may comprise other materials, dimensions, and formation methods.

The buffer oxide layer 106 is formed over the second layer 114 of the high k insulating material 104. The buffer oxide layer 106 comprises a first layer of plasma-enhanced oxide (PEOX) 116 having a thickness of about 2,500 Angstroms that is formed over the second layer 114 of the high k insulating material 104. The layer of PEOX 116 may comprise silicon dioxide that is formed using plasma-enhanced CVD (PECVD) or other methods in some embodiments. In some embodiments, the layer of PEOX 116 comprises plasma-enhanced tetra ethyl oxysilane (PETEOS), for example.

The porous oxide film 120 is formed over the layer of PEOX 116. The porous oxide film 120 comprises a silicon-rich oxide (SRO) in some embodiments. The porous oxide film 120 may alternatively comprise porous silicon dioxide, carbon-doped silicon dioxide, or other materials. The porous oxide film 120 may be deposited using PECVD, metal organic CVD (MOCVD), sub-atmospheric pressure CVD (SACVD), or other methods, as examples. In some embodiments, the porous oxide film 120 comprises a thickness of about 300 Angstroms to about 4,000 Angstroms, for example. In embodiments wherein the porous oxide film 120 comprises carbon-doped silicon dioxide, the porous oxide film 120 may comprise about 18% carbon, for example. Alternatively, the porous oxide film 120 may comprise other amounts of carbon.

In embodiments wherein the porous oxide film 120 comprises SRO, the SRO contains dangling bonds and Si—H bonds that are detectable using Fourier transform infrared (FTIR) spectroscopy in some embodiments, for example. In some embodiments, the porous oxide film 120 is deposited using PECVD by Applied Materials, Inc., for example. Alternatively, the porous oxide film 120 may be deposited using other methods and by processes from other manufacturers.

Alternatively, the layer of PEOX 116 and the porous oxide film 120 of the buffer oxide layer 106 may comprise other materials and dimensions, and may be formed using other methods.

In some embodiments, the porous oxide film 120 of the buffer oxide layer 106 comprises a material comprising a first amount of stress, and the barrier layer 108 comprises a material comprising a second amount of stress, wherein the first amount of stress is less than the second amount of stress. The porous oxide film 120 comprises a stress of about −80 MPa or less in some embodiments, for example.

The porous oxide film 120 comprises an absorbance of about 0 to about $-1\times E^{-1}$ at a wavelength λ of about 2,000 mm to about 2,500 mm, in some embodiments. In other embodiments, the porous oxide film 120 comprises an absorbance of about $6\times E^{-2}$ to about $1.5\times E^1$ at a wavelength λ of about 945 mm to about 1,275 mm, for example. The absorbance of the porous oxide film 120 is measurable using FTIR spectroscopy in accordance with some embodiments, for example. The extent of the porosity of the porous oxide film 120 is measurable using FTIR spectroscopy in some embodiments, for example.

The porous oxide film 120 is disposed over a black level calibration (BLC) region of an image sensor 130 (see image sensor 130 shown in FIGS. 3 through 8) in accordance with some embodiments. The BLC region may be disposed in a pixel region 132, a periphery region 134, a contact pad region 136, or a backside scribe line (BSL) region 138 of the image sensor 130 in accordance with some embodiments. The BLC region comprises a region wherein black level calibration for light obstruction can be performed for the image sensor 130, for example.

The barrier layer 108 is formed over the porous oxide film 120 of the buffer oxide layer 106 in accordance with some embodiments, as shown in FIG. 2. The barrier layer 108 comprises a portion of a color filter-in-a-box (CIAB) 110 in some embodiments, for example. In some embodiments, the barrier layer 108 comprises a layer of SiN having a thickness of about 1,000 Angstroms to about 2,000 Angstroms. In some embodiments, the barrier layer 108 comprises a layer of SiN having a thickness of about 1,500 Angstroms, for example. The CIAB 110 includes a layer of PEOX 118 disposed over the barrier layer 108, and a layer of SiON 119 disposed over the layer of PEOX 118 in some embodiments, as shown in FIG. 2. The layer of PEOX 118 comprises a thickness of about 4,000 Angstroms to about 6,000 Angstroms, and the layer of SiON 119 comprises a thickness of about 1,000 Angstroms to about 2,000 Angstroms in some embodiments. The layer of PEOX 118 comprises a thickness of about 5,500 Angstroms to about 5,600 Angstroms, and the layer of SiON 119 comprises a thickness of about 1,400 Angstroms in some embodiments, as examples. The barrier layer 108 and SiON 119 may be formed using CVD, and the PEOX 118 may be formed using PECVD, as examples. Alternatively, the barrier layer 108, PEOX 118, and SiON 119 may comprise other materials, dimensions, and formation methods.

In some embodiments, the semiconductor device 100 comprises an image sensor 130, as shown in FIGS. 3 through 8. The material layers of the CIAB 110 function as a pixel grid in a pixel region 132 of the image sensor 130 in some embodiments, for example. The semiconductor device 100 may also comprise a logic device or other types of devices.

FIGS. 3 through 7 are cross-sectional views illustrating an image sensor 130 at various stages of manufacturing in accordance with some embodiments. The image sensor 130 comprises a complementary metal oxide semiconductor (CMOS) image sensor (CIS) in some embodiments. The image sensor 130 comprises a backside-illuminated (BSI)

image sensor in some embodiments. Alternatively, the image sensor 130 may comprise other types of imaging sensor devices.

Figure 3:
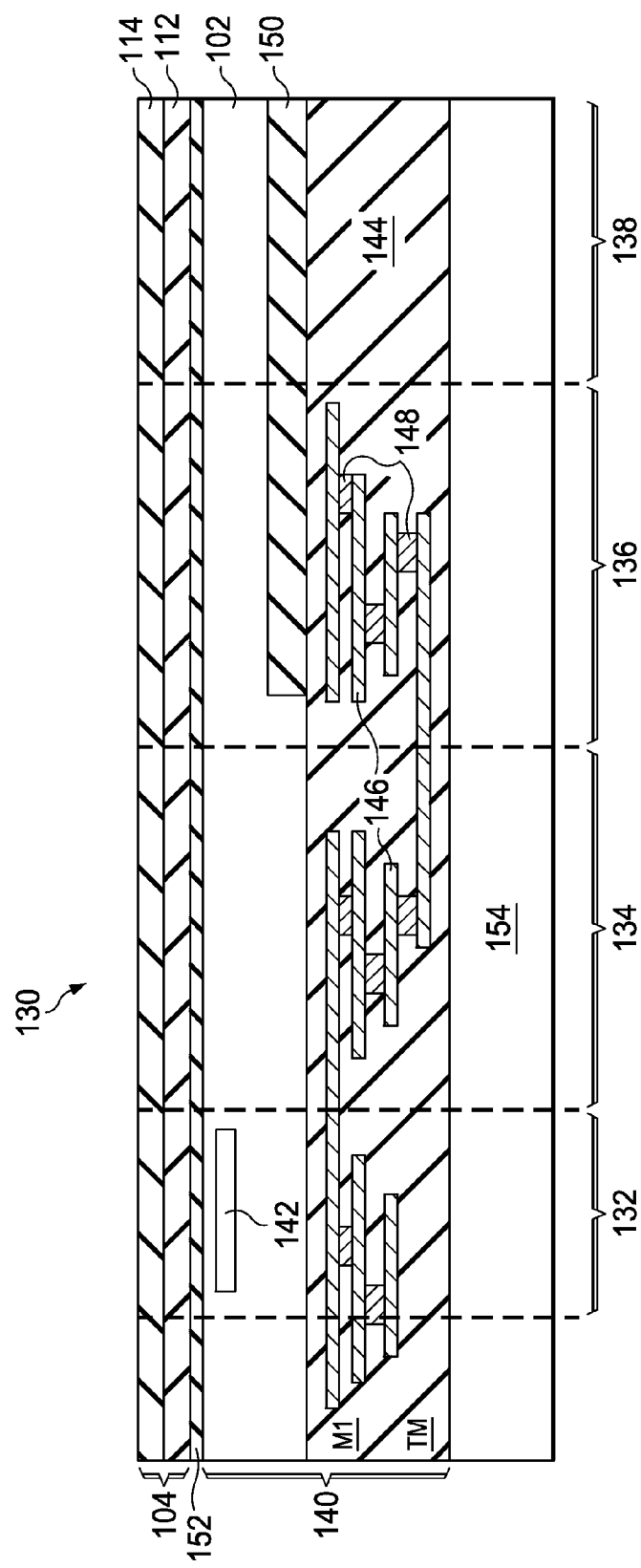
FIGS. 3 through 7 are cross-sectional views illustrating an image sensor at various stages of manufacturing in accordance with some embodiments.

Referring next to FIG. 3, the image sensor 130 comprises an integrated circuit 140 that includes a plurality of devices formed thereon. The integrated circuit 140 includes a workpiece 102 comprising a pixel array region 142 in accordance with some embodiments. The pixel array region 142 of the integrated circuit 140 comprises one or more pixel arrays that include a plurality of photo diodes, for example. Isolation regions 150 comprising shallow trench isolation (STI) regions or other types of insulating structures are formed within portions of the workpiece 102 in some embodiments.

The integrated circuit 140 includes an inter-metal dielectric (IMD) structure formed on a front side thereof in accordance with some embodiments. The IMD structure includes a plurality of insulating material layers 144 and a plurality of conductive lines 146 and a plurality of conductive vias 148 formed within the plurality of insulating material layers 144. The conductive vias 148 and conductive lines 146 provide horizontal and vertical electrical connections for the integrated circuit 140 in some embodiments, for example. Conductive lines 146 in a lower metallization layer (M1) are disposed proximate a surface of the IMD structure proximate the workpiece 102, and conductive lines 146 in an upper or top metallization layer (TM) are formed proximate a surface of the IMD structure opposite the workpiece 102 (e.g., the integrated circuit 140 is inverted in the view shown in FIG. 3).

The integrated circuit 140 and the image sensor 130 include a pixel region 132, a periphery region 134 disposed around the pixel region 132, a contact pad region 136 disposed around the periphery region 134, and a backside scribe line (BSL) region 138 disposed around the contact pad region 136. A top view of the image sensor 130 is shown in FIG. 8, for example. The cross-sectional views shown in FIGS. 3 through 7 show a more detailed view of the integrated circuit 140 and image sensor 130 at view A-A' in FIG. 8, for example. The contact pad region 136 comprises a region where contact pads and/or conductive bumps will be formed for the image sensor 130 package, for example.

Referring again to FIG. 3, in the manufacturing process for the image sensor 130, the front side of the integrated circuit 140 comprising the IMD structure is coupled to a carrier 154. The carrier 154 comprises a sacrificial component such as a substrate comprising an organic, glass, semiconductor material, or other materials. The integrated circuit 140 is temporarily attached to the carrier 154 using a glue or adhesive while the back side of the integrated circuit 140 (e.g., the back side of the image sensor 130) is processed, for example. Later, the carrier 154 is removed.

In some embodiments, a thin oxide layer 152 is formed over the back side of the integrated circuit 140, as shown in FIG. 3. The oxide layer 152 comprises about 10 to 30 Angstroms or less of silicon dioxide in some embodiments formed by CVD or thermal oxidation. The oxide layer 152 comprises a thickness of about 20 Angstroms in some embodiments, for example. In some embodiments, the oxide layer 152 is not included. The oxide layer 152 comprises a buffer layer and/or an adhesion layer between a semiconductive material of the workpiece 102 and the high k insulating material 104 in some embodiments. The oxide layer 152 may comprise a first layer of the high k insulating material 104 in some embodiments. The oxide layer 152 may comprise other materials and dimensions, and may be formed using other methods.

The high k insulating material 104 previously described herein is formed over the thin oxide layer 152, or over the backside of the integrated circuit 140 in embodiments wherein the oxide layer 152 is not included. The high k insulating material 104 is formed over the workpiece 102 of the integrated circuit 140, for example. The high k insulating material 104 is adapted to protect a surface of the workpiece 102 from dark current in some embodiments, for example. Alternatively, the high k insulating material 104 may comprise other functions.

Figure 4:
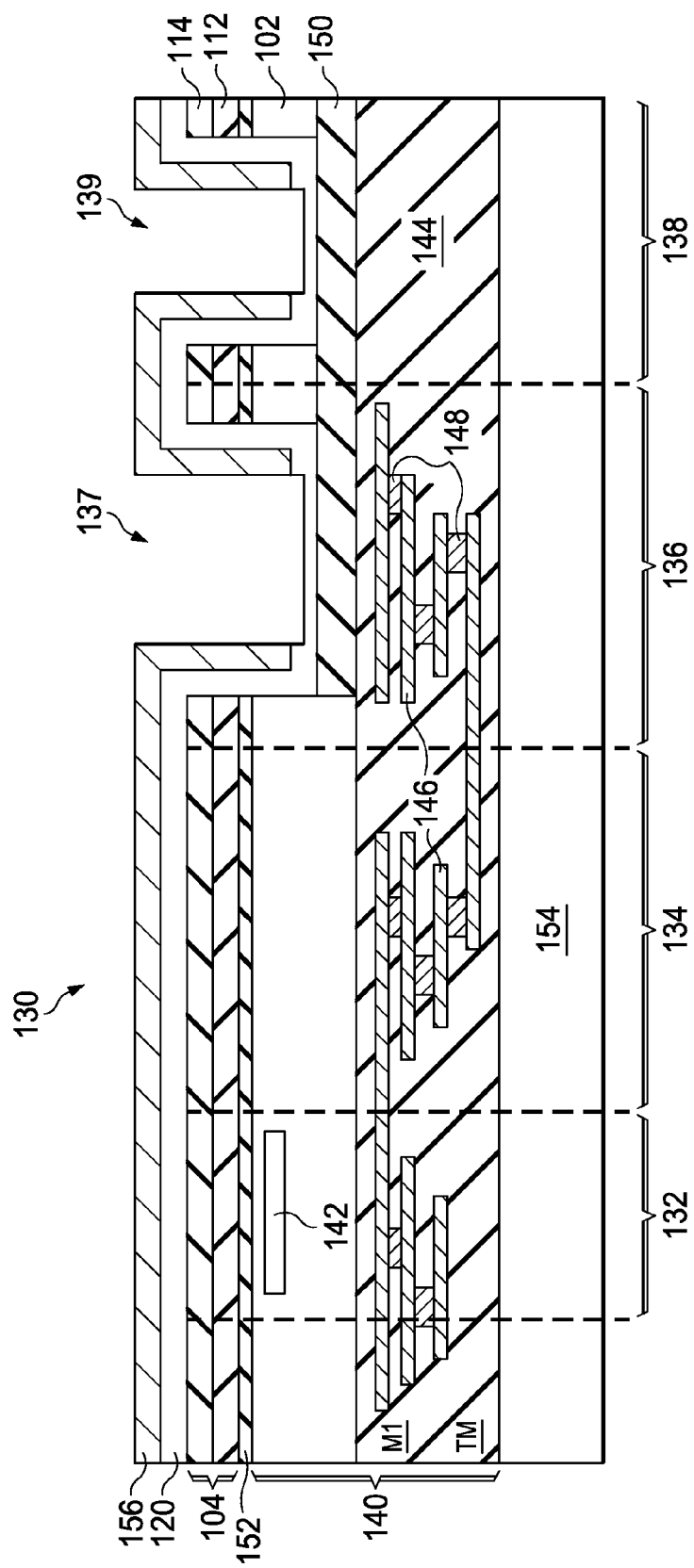

The high k insulating material 104, the thin oxide layer 152, and a top portion of the workpiece 102 is patterned using a lithography process or other process, removing portions of the high k insulating material 104, the thin oxide layer 152, and the top portion of the workpiece 102 in the contact pad region 136 and the BSL region 138, as shown in FIG. 4. For example, a layer of photoresist (not shown) may be deposited over the high k insulating material 104, and the layer of photoresist is exposed to light or energy reflected from or transmitted through a lithography mask (also not shown) having a desired patterned disposed thereon. The layer of photoresist is then developed, and exposed regions (or unexposed regions, depending on whether the photoresist comprises a positive or negative photoresist) are ashed and/or etched away, leaving the patterned layer of photoresist disposed over the high k insulating material 104. The layer of photoresist is then used as an etch mask during an etch process for the high k insulating material 104, the thin oxide film 152, and the top portion of the workpiece 102. The layer of photoresist is then removed.

The etch process for the high k insulating material 104, the oxide layer 152, and the workpiece 102 may be adapted to stop on the isolation regions 150 of the workpiece 102 in some embodiments, for example. The etch process may comprise an etch process with an etch selectivity to the material of the isolation regions 150, for example. The etch process may alternatively comprise a timed etch, as another example.

The porous oxide film 120 is formed over the patterned high k insulating material 104, the oxide layer 152, and the workpiece 102, as shown in FIG. 4. In some embodiments, a conduction layer 156 is formed over the porous oxide film 120. The conduction layer 156 comprises about 300 Angstroms to about 800 Angstroms of Ta, Ti, or other material, in some embodiments, for example. The conduction layer 156 comprises about 600 Angstroms of Ta in some embodiments, for example. The conduction layer 156 may be formed by sputtering or PVD in some embodiments, for example. The conduction layer 156 may alternatively comprise other dimensions, materials, and formation methods. The conduction layer 156 is adapted to release surface charge, for example. In some embodiments, the conduction layer 156 is not included in the image sensor 130.

The conduction layer 156 is removed from portions 137 of the contact pad region 136 and portions 139 of the BSL region 138, also shown in FIG. 4. The conduction layer 156 may be removed using a lithography process, by depositing a layer of photoresist (not shown), patterning the layer of photoresist, and etching the conduction layer 156 using the patterned layer of photoresist as an etch mask. The layer of photoresist is then removed. Other methods may also be used to remove the portions of the conduction layer 156. Some or all of the porous oxide film 120 may be removed from portions 137 of the contact pad region 136 and portions 139 of the BSL region 138 beneath the conduction layer 156 removed, in some embodiments.

Figure 5:
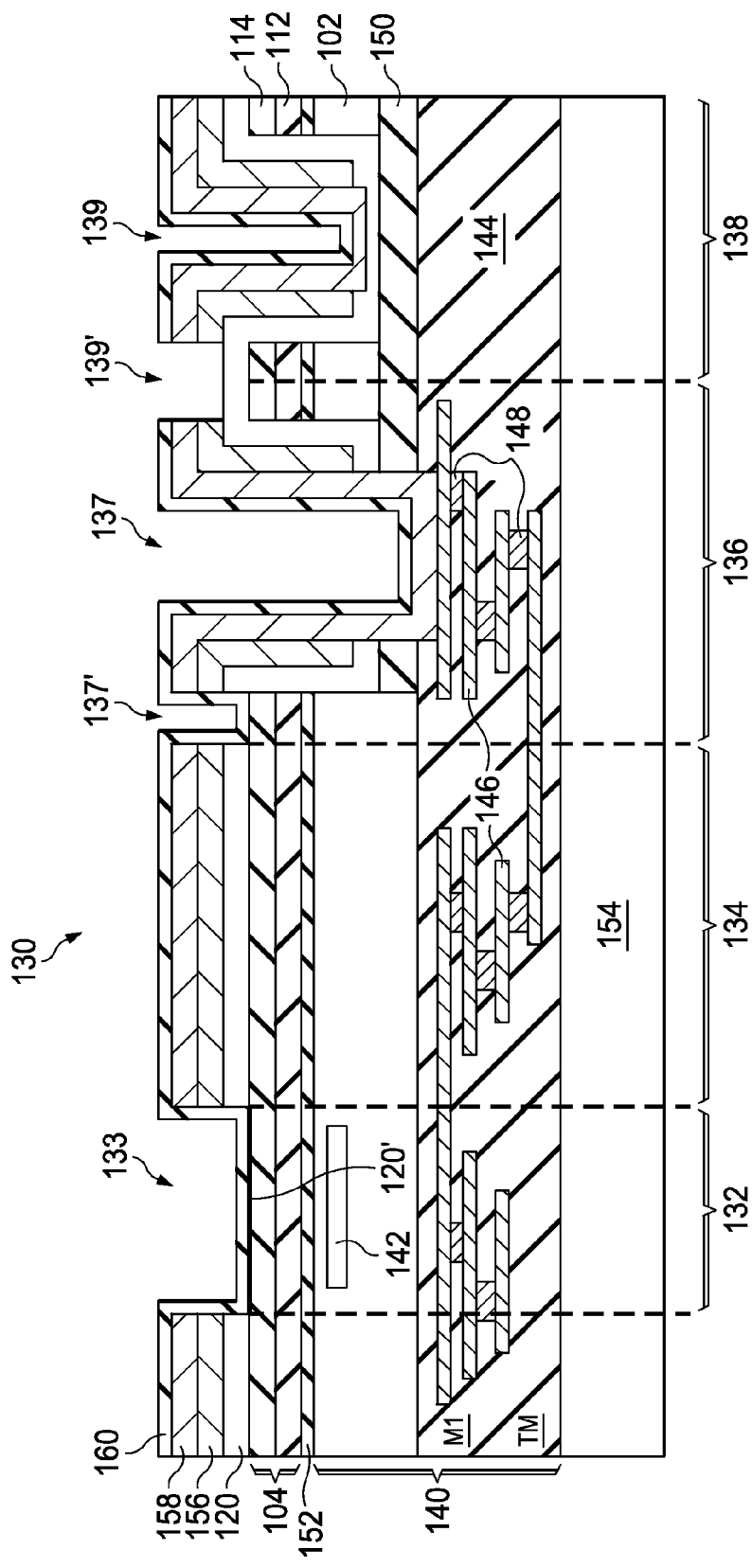

The porous oxide film 120, a portion of the workpiece 102 comprising the isolation region 150, and a portion of the IMD 144 are removed from portions 137 of the contact pad region 136, as shown in FIG. 5. The porous oxide film 120, the portion of the workpiece 102 comprising the isolation region 150, and the portion of the IMD 144 may be removed using a lithography process or other process, for example, by depositing a layer of photoresist (not shown), patterning the layer of photoresist, and etching the porous oxide film 120, the portion of the workpiece 102 comprising the isolation region 150, and the portion of the IMD 144 using the patterned layer of photoresist as an etch mask. The layer of photoresist is then removed.

In some embodiments, a metal shield 158 is formed over the conduction layer 156, also shown in FIG. 5. The metal shield 158 comprises about 4,000 Angstroms to about 7,000 Angstroms of AlCu, in some embodiments, for example. The metal shield 158 comprises about 6,000 Angstroms of AlCu in some embodiments, for example. The metal shield 158 may be formed by sputtering or PVD, in some embodiments, for example. The metal shield 158 may alternatively comprise other dimensions, materials, and formation methods. The metal shield 158 is adapted to avoid light penetration, for example. The metal shield 158 comprises a substantially conformal material that is formed over the conduction layer 156 and lines the patterns in the portions 137 of the contact pad region 136 and lines the patterns in the portions 139 of the BSL region 138.

The metal shield 158, conduction layer 156, and a top portion of the porous oxide film 120 are removed from portions 133 of the pixel region 132, portions 137' of the contact pad region 136, and portions 139' of the BSL region 138, also shown in FIG. 5. The remaining porous oxide film 120' in the portions 133 of the pixel region 132 comprises a thickness of about 600 Angstroms or less in some embodiments, for example. Alternatively, the porous oxide film 120' in the portions 133 of the pixel region 132 may comprise other dimensions. The remaining porous oxide film 120 in the portions 137' of the contact pad region 136 and portions 139' of the BSL region 138 may also comprise a thickness of about 600 Angstroms or less in some embodiments, for example. The metal shield 158, the conduction layer 156, and the top portion of the porous oxide film 120 may be removed using a lithography process, by depositing a layer of photoresist (not shown), patterning the layer of photoresist, and etching the metal shield 158, the conduction layer 156, and the top portion of the porous oxide film 120 using the patterned layer of photoresist as an etch mask. The layer of photoresist is then removed.

In some embodiments, a passivation oxide 160 is formed over the metal shield 158, also shown in FIG. 5. The passivation oxide 160 comprises about 10 Angstroms or less of silicon dioxide in some embodiments. Alternatively, the passivation oxide 160 may comprise other materials and dimensions, or the passivation oxide 160 may not be included.

Figure 6:
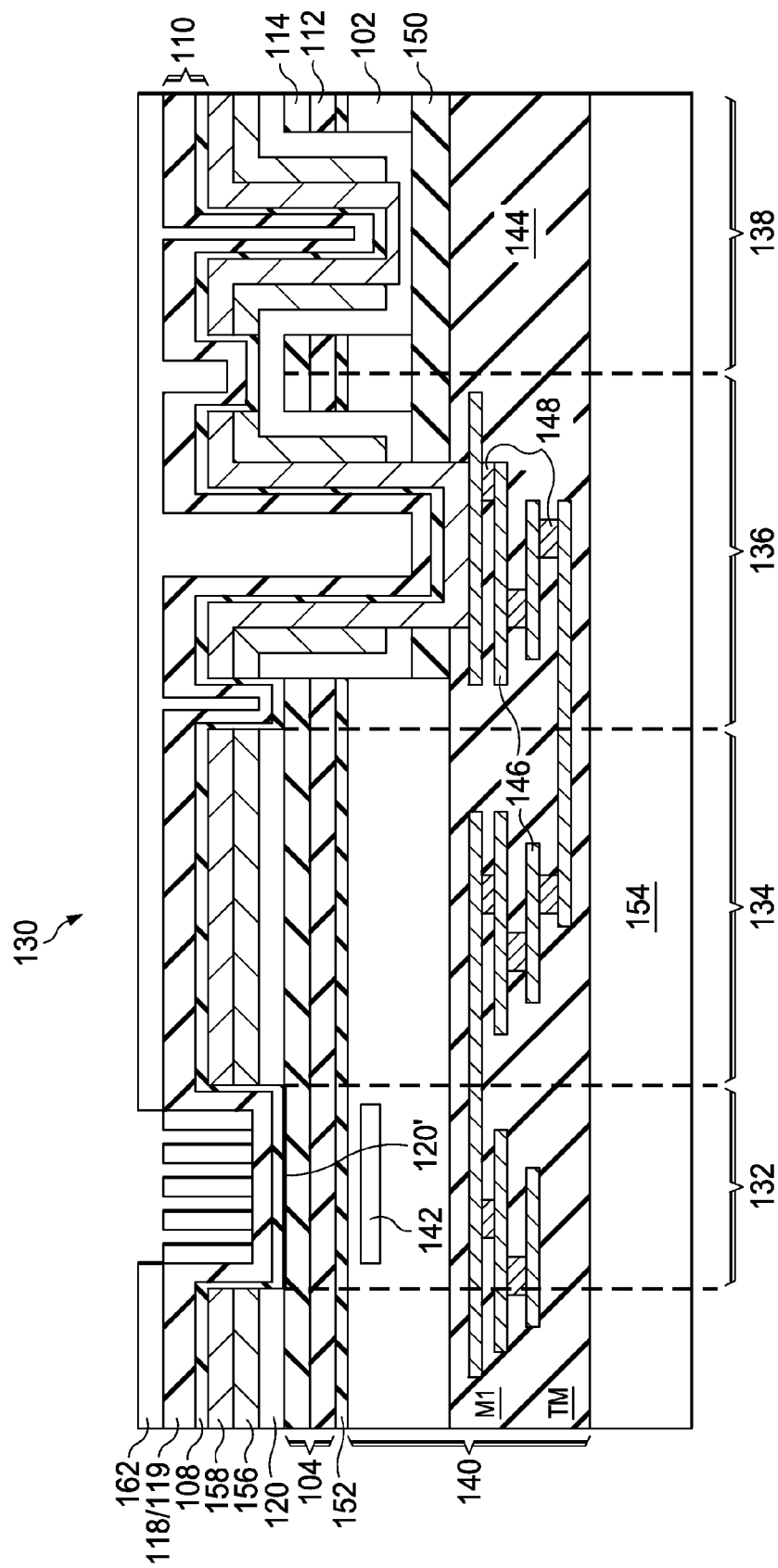

The CIAB 110 is formed over the metal shield 158, as shown in FIG. 6, or over the passivation oxide 160 in embodiments wherein the passivation oxide 160 is included. The passivation oxide 160 is not shown in FIGS. 6 and 7; however, the passivation oxide 160 may be included over the patterned metal shield 158 as shown in FIG. 6, beneath the CIAB 110. The barrier layer 108 of the CIAB 110 is formed over the porous oxide film 120 in portions 133 of the pixel region 132, in portions 137' of the contact pad region 136, and in portions 139' of the BSL region 138 in accordance with some embodiments. The barrier layer 108 of the CIAB 110 is formed over the metal shield 158 in other portions. The layer of PEOX 118 of the CIAB 110 is formed over the barrier layer 108, and the layer of SiON 119 of the CIAB 110 is formed over the layer of PEOX 118 in some embodiments. The layer of PEOX 118 and the layer of SiON 119 of the CIAB 110 are shown as a single layer 118/119 in FIGS. 6 and 7.

A layer of photoresist 162 is formed over the CIAB 110, as shown in FIG. 6. The layer of photoresist 162 comprises a positive photoresist having a thickness of about 15,000 Angstroms in some embodiments. The layer of photoresist 162 may alternatively comprise other materials and dimensions. The layer of photoresist 162 is then patterned using a photolithography process in the pixel region 132, as shown in FIG. 6.

Figure 7:
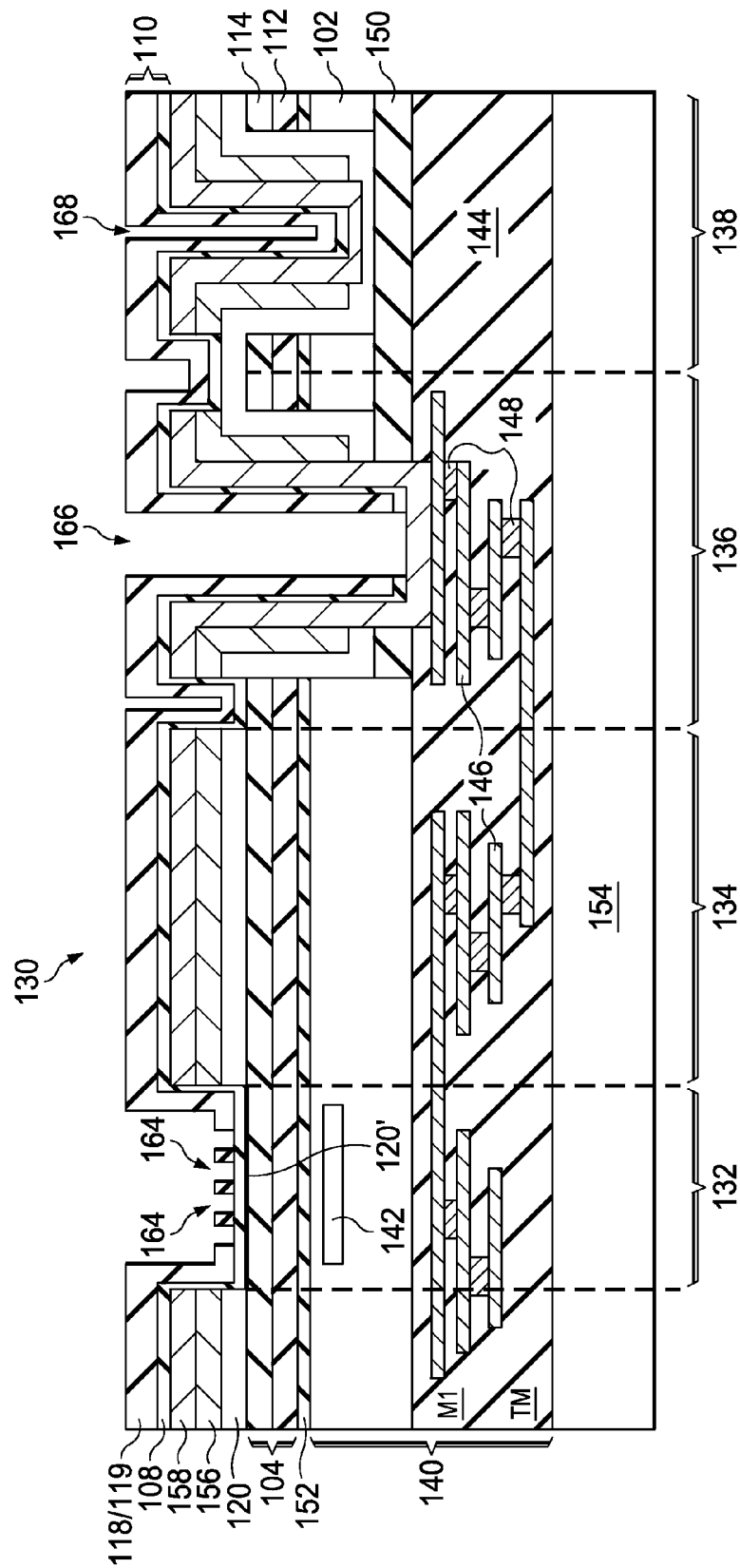
Figure 8:
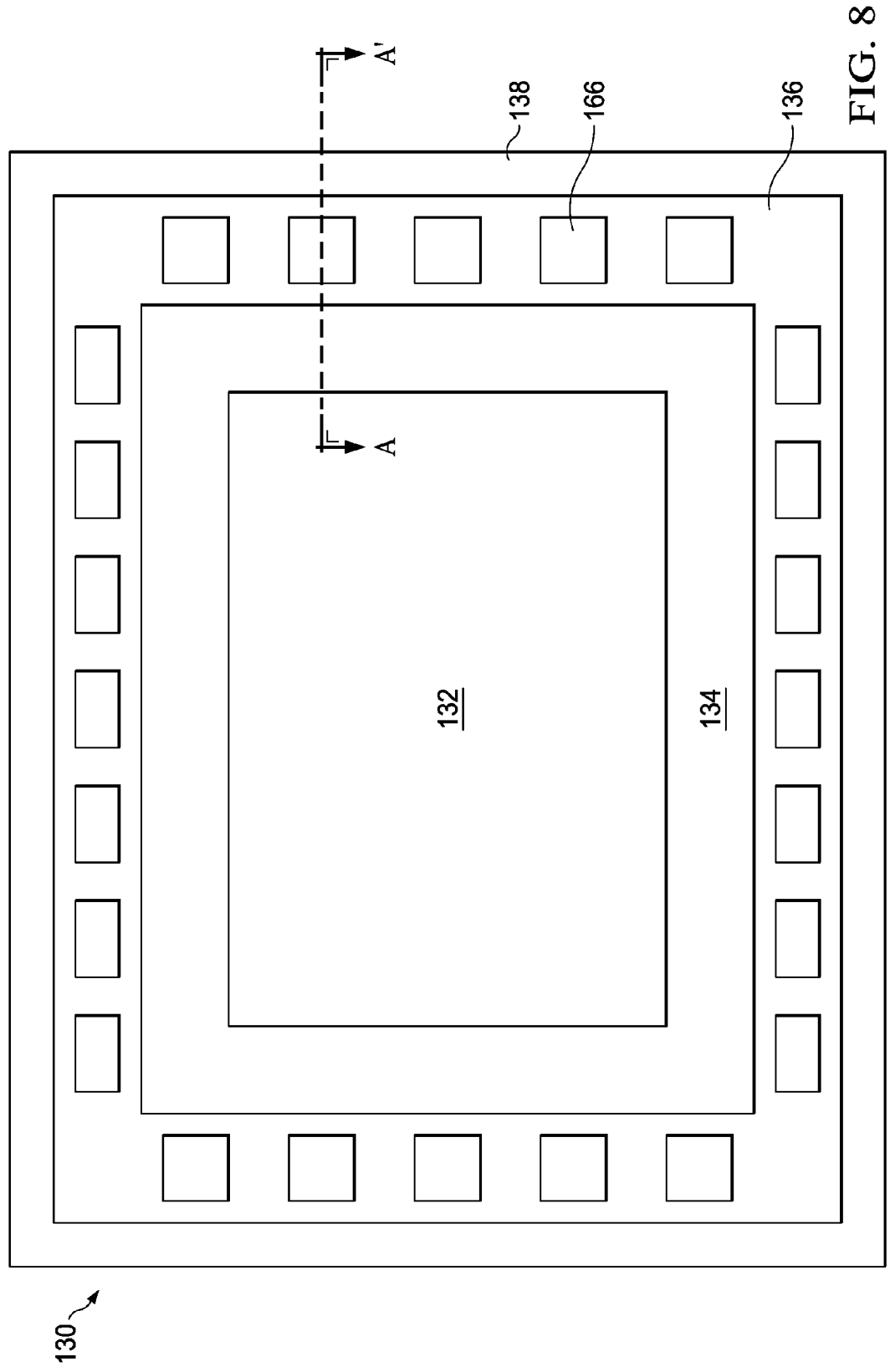
FIG. 8 is a top view of the image sensor shown in FIG. 7 in accordance with some embodiments.

The layer of photoresist 162 is used as an etch mask while portions of the CIAB 110 are removed in the pixel region 132 and the contact pad region 136, as shown in FIG. 7. Layers 118/119 of the CIAB 110 are patterned to form an oxide grid 164 in some embodiments. In other embodiments, the SiN layer 108 of the CIAB 110 is also patterned and is included in the oxide grid 164, not shown. The oxide grid 164 is disposed over pixels (e.g., in a pixel array region 142) of the pixel region 132 of the image sensor 130, in some embodiments. The layer of photoresist 162 is then removed, also shown in FIG. 7.

The manufacturing process is then continued for the image sensor 130, such as forming protective insulating material layers (not shown) over the CIAB 110, forming contact pads (also not shown) in portions 166 of the contact pad region 136, and singulating a plurality of the image sensors 130 along scribe lines 168 in the BSL region 138 to form a plurality of the image sensors 130 (also not shown). The carrier 154 may be removed before or after singulating the plurality of image sensors 130, for example.

FIG. 8 is a top view of the image sensor 130 shown in FIG. 7 in accordance with some embodiments after singulating the image sensors 130 along scribe lines 168 shown in FIG. 7. FIG. 7 is a cross-sectional view at view A-A' of FIG. 8, for example. Contact pads 166 are disposed along a perimeter of the image sensor 130.

Figure 9:
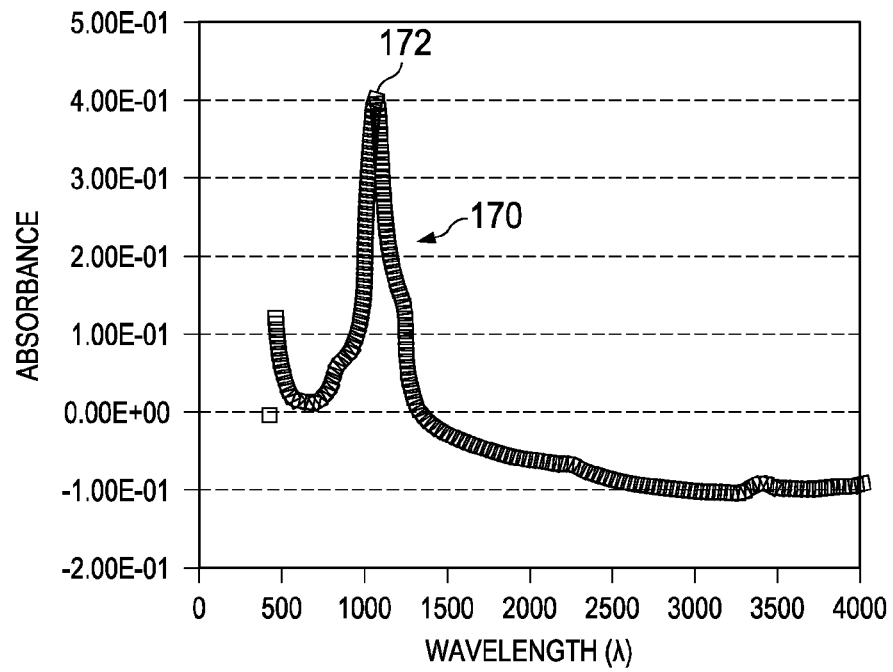
FIG. 9 is a graph illustrating a Fourier Transform Infrared (FTIR) spectrum of absorbance versus wavelength of a porous oxide film in accordance with some embodiments.

FIG. 9 is a graph 170 illustrating an FTIR spectrum of absorbance versus wavelength (λ) of a porous oxide film 120 of the present disclosure in accordance with some embodiments. The porous oxide film 120 comprises an absorbance of about 1 $E^{-1}$ to about 4 $E^{-1}$ (refer to 172 of the graph 170) at a wavelength λ of about 1,000 mm to about 1,300 mm, in some embodiments. Alternatively, the porous oxide film 120 may comprise other absorbances at other wavelengths, in other embodiments.

Figure 10:
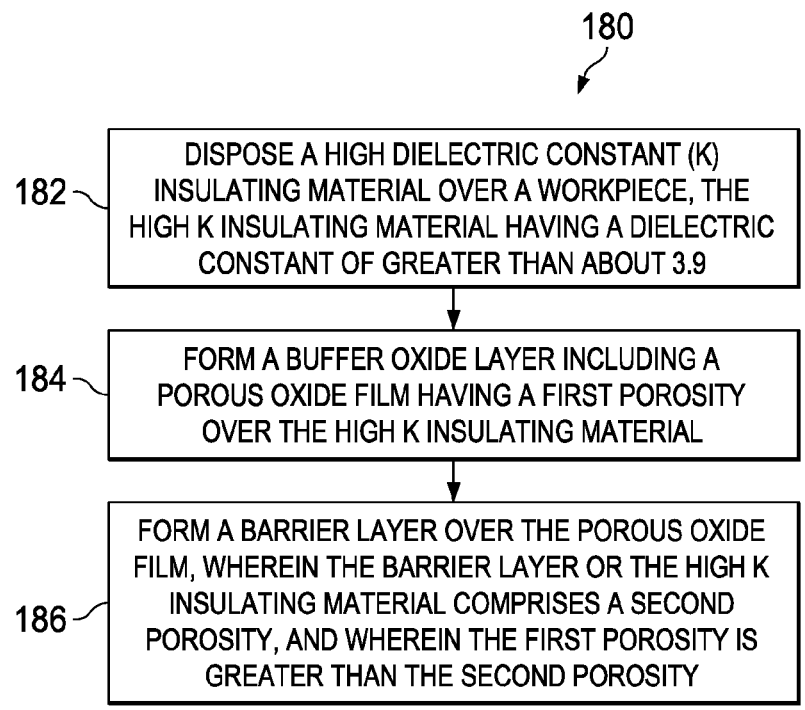
FIG. 10 is a flow chart illustrating a method of manufacturing an image sensor in accordance with some embodiments.

FIG. 10 is a flow chart 180 illustrating a method of manufacturing an image sensor 130 in accordance with some embodiments (see also FIGS. 3 through 7). In step 182, a high k insulating material 104 (FIG. 3) is disposed over a workpiece 102. The high k insulating material 104 has a dielectric constant of greater than about 3.9. In step 184, a buffer oxide layer 106 including a porous oxide film 120 (FIG. 4) having a first porosity is formed over the high k insulating material 104. In step 186, a barrier layer 108 is formed over the porous oxide film 120 (FIG. 6). The barrier layer 108 or the high k insulating material 104 comprises a second porosity, wherein the first porosity is greater than the second porosity.

Some embodiments of the present disclosure comprise semiconductor devices and image sensors that include a buffer oxide layer comprising a porous oxide film. Other embodiments comprise methods of manufacturing the semiconductor devices and image sensors described herein.

Advantages of some embodiments of the present disclosure include providing novel semiconductor devices 100 and image sensors 130 that include the porous oxide films 120 described herein. The buffer oxide layer 106 that includes the porous oxide film 120 decreases or eliminates an amount of peeling or delamination of the barrier layer 108 and/or the high k insulating material 104. The porous oxide film 120 is highly porous and has low stress, and functions as a sponge-like material to dampen, release, and/or balance film stress, e.g., of the high k insulating materials and high stress SiN or oxide films of material layers of the image sensors 130. CMOS image sensors 130 with decreased or improved bubble defects are achievable by implementing embodiments of the present disclosure, for example. Image sensors 130 with improved BLC bubble defects may be manufactured by including the novel porous oxide films 120 in the buffer oxide layers 106 described herein.

In accordance with some embodiments, a semiconductor device includes a high k insulating material disposed over a workpiece, the high k insulating material having a dielectric constant of greater than about 3.9. A barrier layer is disposed over the high k insulating material, and a buffer oxide layer comprising a porous oxide film disposed between the high k insulating material and the barrier layer. The porous oxide film comprises a first porosity, and the barrier layer or the high k insulating material comprises a second porosity. The first porosity is greater than the second porosity.

In accordance with other embodiments, an image sensor includes a workpiece and a high k insulating material disposed over the workpiece. The high k insulating material has a dielectric constant of greater than about 3.9. A barrier layer is disposed over the high k insulating material. A buffer oxide layer comprising a porous oxide film is disposed between the high k insulating material and the barrier layer. The porous oxide film comprises an SRO, porous silicon dioxide, or carbon-doped silicon dioxide. The porous oxide film comprises a first porosity, and the barrier layer or the high k insulating material comprises a second porosity. The first porosity is greater than the second porosity.

In accordance with other embodiments, a method of manufacturing an image sensor includes disposing a high k insulating material over a workpiece. The high k insulating material has a dielectric constant of greater than about 3.9. The method includes forming a buffer oxide layer comprising a porous oxide film and a first porosity over the high k insulating material, and forming a barrier layer over the porous oxide film. The barrier layer or the high k insulating material comprises a second porosity. The first porosity is greater than the second porosity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first oxide layer disposed over a substrate, the substrate comprising a photosensor, a first portion of the first oxide layer physically contacting the substrate from a first side of the photosensor to a second side of the photosensor;
a high dielectric constant (k) insulating material disposed over the first oxide layer, the high k insulating material contacting the first portion of the first oxide layer, the high k insulating material having a dielectric constant of greater than about 3.9;
a barrier layer disposed over the high k insulating material;
a buffer oxide layer comprising a porous oxide film disposed between the high k insulating material and the barrier layer, wherein the porous oxide film comprises a first porosity, wherein the barrier layer or the high k insulating material comprises a second porosity, wherein the first porosity is greater than the second porosity, and wherein the porous oxide film extends completely over the photosensor, wherein the buffer oxide layer comprises a recessed portion above the photosensor, wherein the barrier layer is disposed on sidewalls of the recessed portion and on a top surface of the recessed portion; and
one or more dielectric layers extending over the barrier layer from adjacent the recessed portion to over the recessed portion, the one or more dielectric layers over the recessed portion having openings that expose the barrier layer, wherein the one or more dielectric layers over the recessed portion form a grid structure.

2. The semiconductor device according to claim 1, wherein the porous oxide film comprises a silicon-rich oxide (SRO), porous silicon dioxide, or carbon-doped silicon dioxide.

3. The semiconductor device according to claim 1, wherein the porous oxide film comprises an absorbance of about 0 to about −1×E-1 at a wavelength λ of about 2,000 mm to about 2,500 mm, or wherein the porous oxide film comprises an absorbance of about 6×E-2 to about 1.5×E1 at a wavelength λ of about 945 mm to about 1,275 mm.

4. The semiconductor device according to claim 1, wherein the porous oxide film comprises a stress of about −80 MPa or less.

5. The semiconductor device according to claim 1, wherein the semiconductor device comprises an image sensor or a logic device.

6. An image sensor, comprising:
a workpiece having a photosensor and an intermetal dielectric layer;
a high dielectric constant (k) insulating material disposed over the photosensor opposite the intermetal dielectric layer, the high k insulating material having a dielectric constant of greater than about 3.9;
a barrier layer disposed over the high k insulating material;
a buffer oxide layer comprising a porous oxide film disposed between the high k insulating material and the barrier layer, the porous oxide film comprising a silicon-rich oxide (SRO), porous silicon dioxide, or carbon-doped silicon dioxide, wherein the porous oxide film comprises a recess extending over the photosensor from a first side of the photosensor to a second side of the photosensor, the recess having a first sidewall proximate the first side of the photosensor and a second sidewall proximate the second side of the photosensor, wherein the porous oxide film within the recess has a first thickness and the porous oxide film adjacent the recess has a second thickness greater than the first thickness, wherein the porous oxide film comprises a first porosity, wherein the barrier layer or the high k insulating material comprises a second porosity, and wherein the first porosity is greater than the second porosity; and a dielectric layer extending conformally over the barrier layer disposed adjacent the recess, over the barrier layer disposed on the first sidewall of the recess, and over the barrier layer disposed within the recess, wherein the dielectric layer has a plurality of openings that expose a surface of the barrier layer disposed within the recess.

7. The image sensor according to claim 6, wherein the porous oxide film is disposed over a black level calibration (BLC) region of the image sensor.

8. The image sensor according to claim 6, wherein the image sensor includes a pixel region, a periphery region disposed around the pixel region, a contact pad region disposed around the periphery region, and a backside scribe line (BSL) region disposed around the contact pad region, and wherein the buffer oxide layer is disposed in the pixel region, the periphery region, the contact pad region, or the BSL region.

9. The image sensor according to claim 8, wherein the porous oxide film of the buffer oxide layer comprises a thickness of about 600 Angstroms or less in the pixel region.

10. The image sensor according to claim 6, wherein the high k insulating material comprises a first layer comprising HfO and a second layer comprising $Ta_2O_5$ disposed over the first layer.

11. The image sensor according to claim 10, wherein the first layer comprises a thickness of about 30 Angstroms to about 80 Angstroms, or wherein the second layer comprises a thickness of about 400 Angstroms to about 600 Angstroms.

12. The image sensor according to claim 6, wherein the plurality of openings in the dielectric layer forms a grid.

13. The image sensor according to claim 12, wherein the barrier layer comprises a layer of SiN, wherein the dielectric layer comprises one or more dielectric films comprising a first dielectric sublayer and a second dielectric sublayer, and wherein:

the first dielectric sublayer comprises a layer of plasma-enhanced oxide (PEOX) disposed over the layer of SiN; and the second dielectric sublayer comprises a layer of SiON disposed over the layer of PEOX.

14. The image sensor according to claim 13, wherein the layer of SiN comprises a thickness of about 1,000 Angstroms to about 2,000 Angstroms, wherein the layer of PEOX comprises a thickness of about 4,000 Angstroms to about 6,000 Angstroms, or wherein the layer of SiON comprises a thickness of about 1,000 Angstroms to about 2,000 Angstroms.

15. A method of manufacturing an image sensor, the method comprising:

disposing an intermetal dielectric layer over a first side of a photosensor in a workpiece;

disposing a high dielectric constant (k) insulating material over a second side of the photosensor in the workpiece, the high k insulating material having a dielectric constant of greater than about 3.9;

forming a buffer oxide layer comprising a porous oxide film having a first porosity over the high k insulating material, the porous oxide film covering the photosensor in a continuous layer;

removing a first portion of the porous oxide film covering the photosensor such that the first portion of the porous oxide film covering the photosensor has a first thickness that is less than a second thickness of a second portion of the porous oxide film not covering the photosensor; and forming a barrier layer over the porous oxide film, wherein the barrier layer or the high k insulating material comprises a second porosity, and wherein the first porosity is greater than the second porosity.

16. The method according to claim 15, wherein forming the buffer oxide layer comprises forming a porous oxide film comprising a thickness of about 300 Angstroms to about 4,000 Angstroms.

17. The method according to claim 15, wherein forming the porous oxide film of the buffer oxide layer comprises forming a material comprising a first amount of stress, wherein forming the barrier layer comprises forming a material comprising a second amount of stress, and wherein the first amount of stress is less than the second amount of stress.

18. The method according to claim 15, wherein forming the buffer oxide layer comprising forming a layer of plasma enhanced oxide (PEOX) over the high k insulating material, and forming the porous oxide film over the layer of PEOX.

19. The method according to claim 18, wherein forming the layer of PEOX comprises forming a layer having a thickness of about 2,500 Angstroms.

20. The method according to claim 15, wherein the method comprises forming a complementary metal oxide semiconductor (CMOS) image sensor (CIS) or a backside-illuminated image sensor.

* * * * *